(12) United States Patent
Bangar et al.

(10) Patent No.: US 11,609,505 B2
(45) Date of Patent: Mar. 21, 2023

(54) APPARATUS AND METHODS FOR VERIFICATION AND RE-USE OF PROCESS FLUIDS

(71) Applicant: Applied Materials, Inc., Santa Clara, CA (US)

(72) Inventors: Mangesh Ashok Bangar, San Jose, CA (US); Gautam Pisharody, Newark, CA (US); Lancelot Huang, San Jose, CA (US); Alan L. Tso, San Jose, CA (US); Douglas A. Buchberger, Jr., Livermore, CA (US); Huixiong Dai, San Jose, CA (US); Dmitry Lubomirsky, Cupertino, CA (US); Srinivas D. Nemani, Sunnyvale, CA (US); Christopher Siu Wing Ngai, Burlingame, CA (US)

(73) Assignee: Applied Materials, Inc., Santa Clara, CA (US)

( * ) Notice: Subject to any disclaimer, the term of this patent is extended or adjusted under 35 U.S.C. 154(b) by 61 days.

(21) Appl. No.: 17/222,696

(22) Filed: Apr. 5, 2021

(65) Prior Publication Data

US 2022/0317579 A1 Oct. 6, 2022

(51) Int. Cl.
*G03F 7/20* (2006.01)
*G01N 27/10* (2006.01)

(52) U.S. Cl.
CPC ........ *G03F 7/70916* (2013.01); *G03F 7/2041* (2013.01); *G01N 27/10* (2013.01)

(58) Field of Classification Search
CPC .... G03F 7/70916; G03F 7/2041; G01N 27/10
See application file for complete search history.

(56) References Cited

U.S. PATENT DOCUMENTS

| | | | |
|---|---|---|---|
| 8,664,004 B2 * | 3/2014 | Spiegelman | G01N 1/2214 436/178 |
| 9,785,061 B2 * | 10/2017 | De Graaf | G03F 7/7085 |

(Continued)

FOREIGN PATENT DOCUMENTS

| | | |
|---|---|---|
| JP | 2014153271 A | 8/2014 |
| KR | 20030006544 A | 1/2003 |

OTHER PUBLICATIONS

International Search Report and Written Opinion dated Jun. 29, 2022 for Application No. PCT/US2022/020760.

*Primary Examiner* — Hung V Nguyen
*Assistant Examiner* — Hung Henry Nguyen
(74) *Attorney, Agent, or Firm* — Patterson + Sheridan, LLP

(57) ABSTRACT

Embodiments of the present disclosure generally relate to apparatus and methods for verification and re-use of process fluids. The apparatus generally includes a tool for performing lithography, and a recirculation path coupled to the tool. The recirculation path generally includes a collection unit coupled at first end to a first end of the tool, and a probe coupled at a first end to a second end of the collection unit, the probe for determining one or more characteristics of a fluid flowing from the tool. The recirculation path of the apparatus further generally includes a purification unit coupled at a first end to a third end of the collection unit, the purification unit further coupled at a second end to a second end of the probe, the purification unit for changing a characteristic of the fluid.

21 Claims, 4 Drawing Sheets

(56) References Cited

U.S. PATENT DOCUMENTS

| | | |
|---|---|---|
| 2005/0016929 A1* | 1/2005 | Kashkoush ............. C02F 9/005 210/96.1 |
| 2007/0119816 A1 | 5/2007 | Urquhart et al. |
| 2015/0027552 A1 | 1/2015 | Hsu et al. |
| 2022/0113177 A1* | 4/2022 | Buchberger, Jr. ..... G01F 23/245 |

* cited by examiner

APPARATUS AND METHODS FOR VERIFICATION AND RE-USE OF PROCESS FLUIDS

BACKGROUND

Field

Embodiments of the present disclosure generally relate to apparatus and methods for verification of process fluids and re-use of process fluids.

Description of the Related Art

During substrate processing, process fluids come into contact with photoresist and become contaminated as a result. The contamination can be particles or photochemical by-products leached from the substrate and photoresist materials, the processing environment, and components of the processing chamber. Such contamination results in deterioration of the electrical properties, such as resistivity, of the process fluids. Moreover, the contamination negatively influences control over, e.g., semiconductor structures in lithographic processes. As a result, controlling process fluid contamination is an important factor in substrate processing.

Conventionally, such process fluids are used once and discarded because of these contamination issues. However, because the process fluids are expensive and in limited supplies, their one-time use represents a substrate-manufacturing hurdle. Further, the characteristics/properties of the process fluids can vary between suppliers and batches, leading to inconsistent substrate processing.

There is a need for apparatus and methods for verification of process fluids and re-use of process fluids.

SUMMARY

Embodiments of the present disclosure generally relate to apparatus and methods for verification and re-use of process fluids.

In an embodiment, an apparatus is provided. The apparatus includes a tool for performing lithography, and a recirculation path coupled to the tool. The recirculation path includes a collection unit coupled at first end to a first end of the tool, and a probe coupled at a first end to a second end of the collection unit, the probe for determining one or more characteristics of a fluid flowing from the tool. The recirculation path of the apparatus further includes a purification unit coupled at a first end to a third end of the collection unit, the purification unit further coupled at a second end to a second end of the probe, the purification unit for changing a characteristic of the fluid.

In another embodiment, a method is provided. The method flowing a fluid from a tool to a collection unit, the collection unit disposed along a recirculation path, the recirculation path further comprising a purification unit fluidically coupled to the collection unit. The method further includes flowing the fluid from the collection unit to a probe disposed along the recirculation path, determining a first value of a characteristic of the fluid, comparing the first value of the characteristic to a threshold value or range, and changing a flow path of the fluid based on the first value.

In another embodiment is provided a non-transitory computer-readable medium storing instructions that, when executed on a processor, perform operations for fluid verification or fluid reclamation. The operations include flowing a fluid from a tool to a collection unit, the collection unit disposed along a recirculation path, the recirculation path further comprising a probe fluidically coupled to the collection unit, and a purification unit fluidically coupled to the collection unit. The operations include flowing the fluid from the collection unit to the probe, determining a first resistivity of the fluid, comparing the first resistivity to a threshold value or range, and changing a flow path of the fluid based on the first resistivity.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The inventors have found new apparatus and methods for verification and re-use of process fluids. Briefly, embodiments described herein utilize a recirculation path through which through which a process fluid flows. The path includes a probe to monitor/measure one or more characteristics of the process fluid and to verify the process fluids, and a purification unit or reconditioning system to clean the process fluids. The embodiments described herein enable control over the electrical characteristics and the cleanliness of the process fluids, and can be integrated with various tools for substrate processing. The process fluids can be purified to meet the requirements for substrate processing and re-used for processing, decreasing costs associated with substrate processing and mitigating effects of any change in supply of the process fluids. Moreover, because the process fluids can vary between suppliers, the apparatus and methods described herein can also be utilized to maintain consistency between process fluids entering substrate processing tools.

Figure 1:
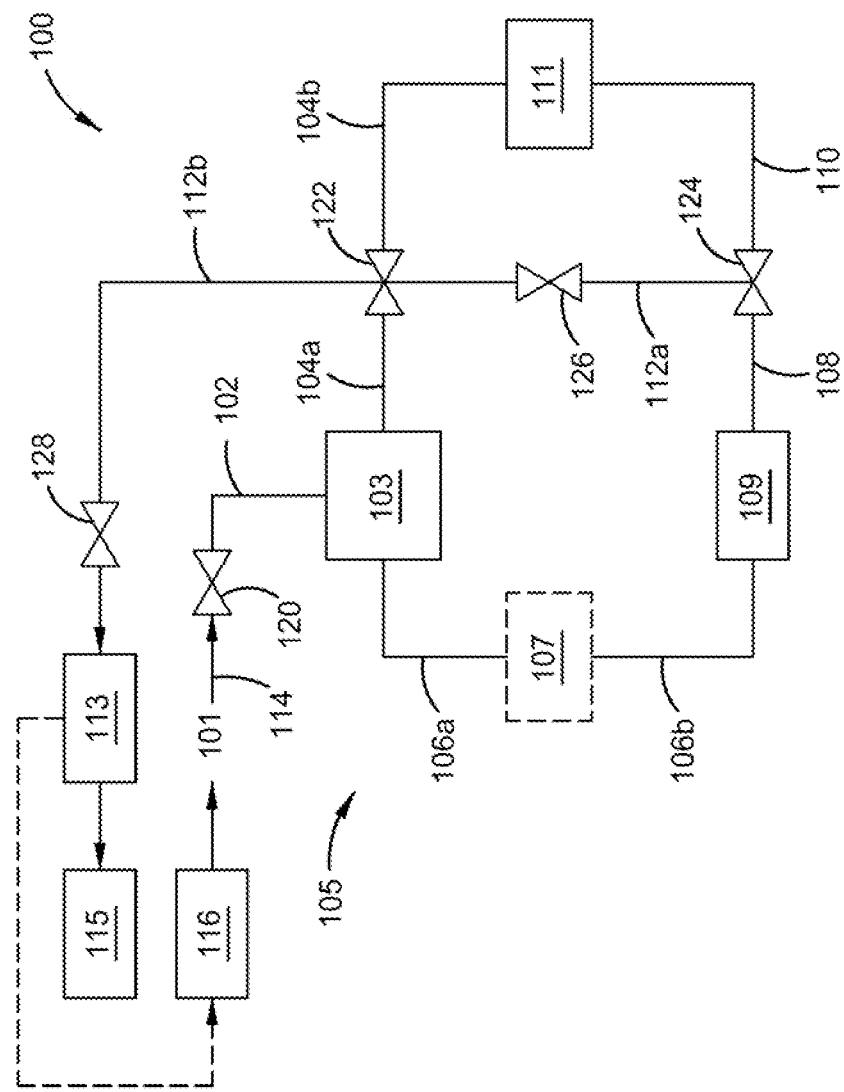
FIG. 1 is a schematic of an example apparatus for verifying a process fluid according to at least one embodiment.

FIG. 1 is a schematic of an example apparatus 100 for verifying properties, and for reclamation or re-use, of a process fluid according to at least one embodiment. The apparatus 100 enables monitoring properties of used process fluids entering and exiting tools utilized for substrate processing and purifying the used process fluids. The apparatus 100 also enables monitoring properties of unused process fluids and purifying the unused process fluids.

The apparatus 100 generally includes a recirculation path 105 for the circulation of a process fluid 101. Components along the recirculation path 105 include a collection unit 103 for collecting used or unused process fluid 101, a probe 109 for determining one or more characteristics of the process fluid 101, and a purification unit 111 for purifying, cleaning, or otherwise removing impurities from, the process fluid 101. The process fluid 101 can be a used process fluid exiting from a tool 116 for substrate processing. Additionally, or alternatively, the process fluid 101 can be an unused process fluid. The process fluid, whether used or unused, is coupled to an inlet line 102 via line 114. Line 114 and inlet line 102 can be the same or different lines.

Process fluid 101 enters the recirculation path 105 via the inlet line 102 coupled to the collection unit 103, and exits the recirculation path 105 by an outlet line 112b. The recirculation path 105 fluidically couples each of the collection unit 103, the probe 109, and the purification unit 111 to the inlet line 102 and the outlet line 112b. Upon exiting the recirculation path 105, the process fluid 101 can be flowed directly to a tool 115 for substrate processing or collected in a reservoir 113 where it can be stored for use in the tool 115 for substrate processing. Additionally, or alternatively, and although not shown, the process fluid 101 can be flowed from the recirculation path 105 directly to the tool 116 or collected in a reservoir, e.g., reservoir 113 (and/or a separate reservoir) where it can be stored for use in the tool 116 for substrate processing. In such embodiments, outlet line 112b (or a separate outlet line) can be coupled to the tool 116 by a valve.

Figure 3:
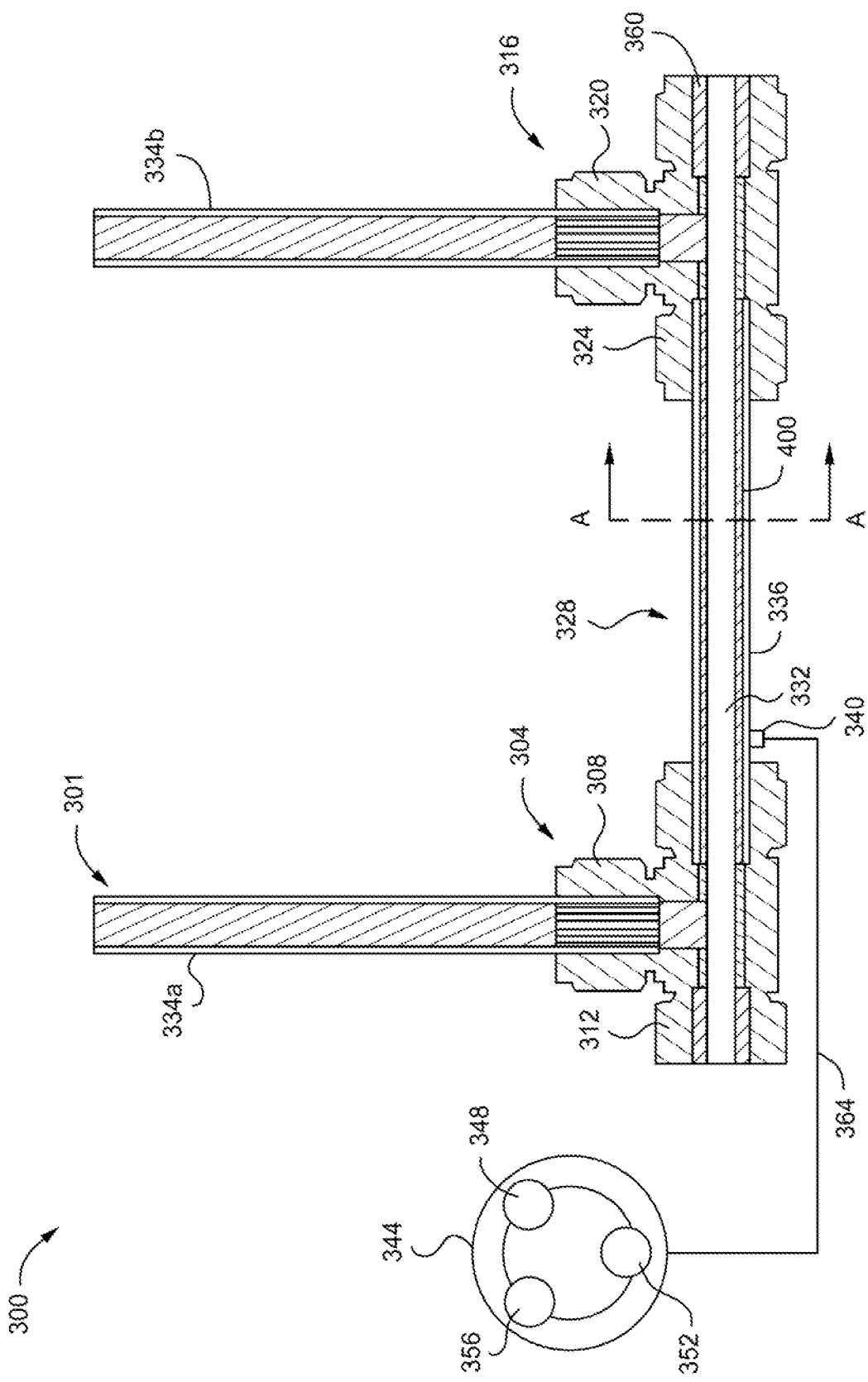
FIG. 3 is a schematic, cross-sectional view of a probe for measuring and determining one or more characteristics of a process fluid according to at least one embodiment.

The collection unit 103 collects used process fluid 101 from a substrate processing tool and/or unused process fluid. In some examples, the collection unit 103 includes a refill tank to hold or otherwise store the process fluid 101 and a pumping element to draw the process fluid 101 to the collection unit 103 via the inlet line 102. The collection unit 103 is coupled, via lines 106a, 106b, to the probe 109. A schematic of the probe 109 is shown in FIG. 3. Briefly, the probe 109 enables the determination of one or more characteristics of the process fluid 101 relating to whether the process fluid 101 can be used for substrate processing. Based on this determination, the process fluid can be purified. Thus, embodiments described herein can be utilized for process fluid verification and/or detecting a status of a process fluid.

The collection unit 103 is also coupled to a purification unit 111 by lines 104a, 104b. The purification unit 111 includes apparatus to purify, clean, or otherwise remove impurities from, the process fluid 101. Such impurities can include water, metals, organic compounds, and fine particles. The apparatus in purification unit 111 can perform various methods including guard-bed treatment, membrane treatment, carbon-bed treatment, cooling, filtration, electrostatic filtration, polishing filtration, scrubbing, purification, chemical cleaning, vacuum distillation, fractional distillation, evaporation, extraction, or combinations thereof. As such, the purification unit 111 can include guard bed(s), carbon bed(s), ion-exchange resin(s), membrane(s), heat exchanger(s), chiller(s), filter(s), scrubber(s), purify(iers), chemical(s) to clean the fluid, distillation apparatus, among other suitable equipment for purifying, cleaning, or otherwise removing impurities from, the process fluid 101. The guard bed(s), carbon bed(s), ion-exchange resin(s), membrane(s), and similar apparatus can be selective for particle size, molecular weight, and other suitable parameters. In some embodiments, the purification unit 111 includes polishing filter(s), carbon bed(s), molecular sieves, desiccants, and/or distillation apparatus. The polishing filters can be used to remove suspended or fine solids from the process fluid 101. The carbon bed, containing activated carbon, can be utilized to remove impurities from the process fluid 101. Molecular sieves and/or desiccants are used to remove water from the process fluid 101 in some examples. The distillation apparatus can be used to separate components of the process fluid 101 based on differences in boiling points. The distillation apparatus can be equipped with a vacuum to enable purification of materials not readily distilled at ambient pressures.

As shown in FIG. 1, the probe 109 is also coupled to the purification unit 111 by line 108, line 112a, and line 104b, enabling re-use of the process fluid 101 that enters the probe 109. An optional filter unit 107 can be disposed between the collection unit 103 and the probe 109. The optional filter unit 107 can include apparatus or device(s) to remove species (e.g., contaminants and/or particles) from the process fluid 101 that could clog, or otherwise block fluids from entering or exiting, the probe 109. Additionally, or alternatively, the optional filter unit 107 can also include apparatus to remove species from the process fluid 101 that could otherwise impair functionality of the probe 109. Additionally, or alternatively, the filter unit can be used for rough filtering con protect components in purification unit 111. In some examples, the optional filter unit 107 includes a filter to remove, or substantially remove, species from the process fluid 101 having a size from about 10 nm to about 100 nm.

In operation, the process fluid 101 exiting a tool or chamber (if used) is flowed to the collection unit 103 by opening valve 120. A portion of the process fluid 101 is flowed to the probe 109, via lines 106a, 106b, where operations are performed to determine one or more characteristics of the process fluid 101. The operations performed by the probe 109 as well as other operations are discussed below in relation to FIG. 2.

If the one or more characteristics of the process fluid 101 do not satisfy one or more threshold values for such characteristics, valve 122 is opened to connect lines 104a, 104b, and the process fluid 101 is flowed to the purification unit 111. After purification, the process fluid 101 exiting the purification unit 111 can exit the recirculation path 105 and flowed to reservoir 113 via lines 110, 112a, and 112b. Here, valve 124 is opened to connect lines 110, 112a. Valve 126 and valve 122, and valve 128 are also opened to connect lines 112a, 112b such that the process fluid 101, which is purified or otherwise suitable for use in substrate processing, can enter reservoir 113.

If the one or more characteristics of the process fluid 101 satisfy one or more threshold values for such characteristics, valve 122 is opened to connect line 104a and line 112. Valve 128 is also opened to connect lines 104a, 112b, and feed the process fluid 101 to the reservoir 113. Process fluid 101 can then be flowed to the tool 115 (or chamber) for use in substrate processing or the tool 116 (or chamber) for use in substrate processing. Exemplary tools 115, 116 includes those tools for performing post-exposure bake (PEB) and field enhanced post-exposure bake (FE-PEB), among others. Other tools include those tools for performing lithography, performing cyclical layer deposition (CLD), atomic layer deposition (ALD), chemical vapor deposition (CVD), physical vapor deposition (PVD), and/or other substrate processes. In some aspects, the process fluid 101 exiting the tool 116 and flowed through one or more components of the recirculation path 105 (for, e.g., verification and/or purification) can re-enter the same tool 116 or enter a different tool, e.g., tool 115.

The portion of process fluid 101 that is flowed to the probe 109 can also be purified. Here, the process fluid 101 exits the probe 109 via line 108. Valve 124 is opened to connect lines 108, 112. Valve 126 and valve 122 are also opened such that the process fluid can be flowed from the line 112a to the line 104b. The process fluid 101 can then be flowed to the purification unit 111. The process fluid can exit the purification unit 111 and flowed to the reservoir 113 as described above. It is contemplated that one or more of the elements described in FIG. 1 may be coupled to a controller (e.g., controller 344 shown in FIG. 3).

Although not shown in FIG. 1, it should be understood that additional equipment for controlling, e.g., temperature, pressure, and the flow of the process fluid 101 as well as one or more components of the apparatus 100. For example, heat exchangers can be used to cool or heat the process fluid 101 traveling along the various lines or within various units of the apparatus 100, while pumps and motors can be utilized to control the rate of flow of the materials in apparatus 100. Various process controls can also be used such as pressure indicators, differential pressure cells, temperature indicators, thermocouples, temperature switches, resistance temperature detectors, solenoids, flowmeters, flow regulators and valves, humidity sensors, ammeters, current meters, liquid level detectors, feed level probes, and/or electrical drives.

Figure 2:
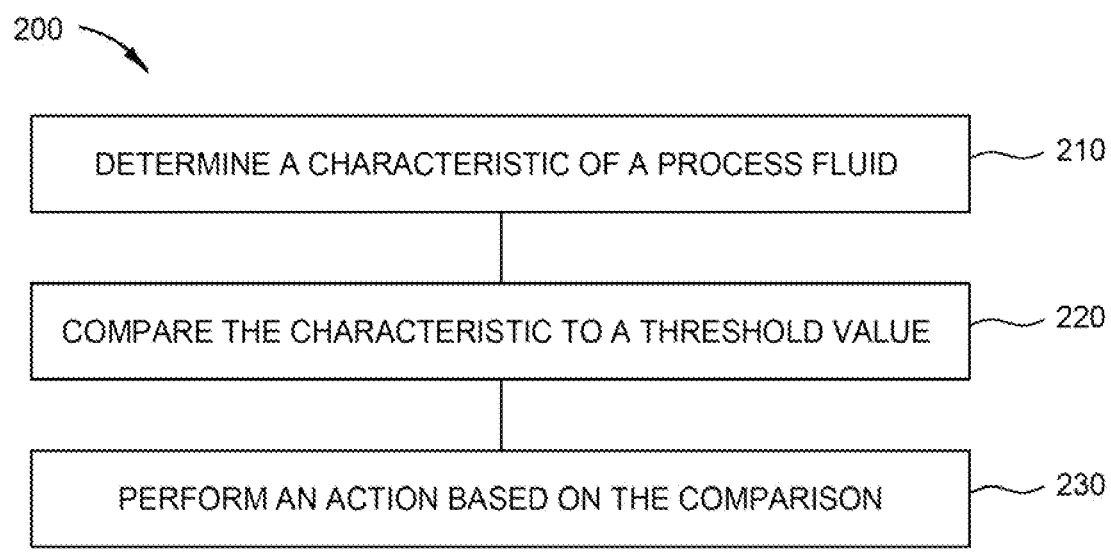
FIG. 2 is a flowchart showing selected operations of a method for verifying a process fluid according to at least one embodiment.

FIG. 2 is a flowchart showing selected operations of a method 200 for verifying properties, and for reclamation or re-use, of a process fluid. The process fluid, e.g., process fluid 101, can be a used fluid or an unused fluid obtained from a vendor. Although the discussion of FIG. 2 is related to resistivity of the process fluid 101, other characteristics such as concentration of water in the process fluid, dielectric constant of the process fluid, and gas content of the process fluid can be determined. Optionally, a particle counter system can be added along the recirculation path 105 to ensure that the process fluid is free or substantially free of contaminants.

At operation 210, one or more characteristics of the process fluid 101 used for substrate processing is determined. For fluid resistivity measurements, a voltage is applied to a probe (e.g., probe 300 shown in FIGS. 3 and 4) configured to flow the process fluid 101 therethrough. Probe 300 is a non-limiting example of a probe that can be used with embodiments described herein as other probes, and modifications thereof, are contemplated.

The voltage generates a current to flow from the metal rod 332 through the process fluid 101 into the ground electrode 336. A resistivity of the process fluid 101 is calculated based upon the current that flows through the process fluid 101 within the probe 300. For example, a voltage (V) is applied by a voltage source (not shown) to the metal rod 332 surrounded by the ground electrode 336. Current (I) flows from the metal rod 332 through the gap 400 into the ground electrode 336. A cross-section of the gap 400 is substantially toroid in shape. The voltage is applied to the metal rod 332 from about 50 V to about 500 V, such as from about 100 V to about 450 V, such as from about 150 V to about 400 V, such as from about 200 V to about 350 V, such as from about 250 V to about 300 V. In another example, the voltage is applied to the metal rod 332 from about 75 V to about 150 V, such as from about 100 V to about 125 V. In another example, the voltage is less than about 500 V.

The controller 344, shown in FIG. 3, measures the current and calculates a resistance (R), the controller 344 being electrically coupled to the ground electrode 336 through the contact 340. The metal rod 332 and the ground electrode 336 are known metals, so the controller 344 can be programmed to filter out resistance inherent to the metals used in the metal rod 332 or the ground electrode 336.

A resistivity ($p=RA/L$) of the process fluid 101 is determined based upon the calculated resistance, where R is the calculated resistance, A is the surface area of the ground electrode 336 and L is the distance between the metal rod 332 and the ground electrode 336. In one example, the resistivity (p) is proportional to the surface area of an inner surface ($A=2\pi r*l_1$) of the ground electrode 336, where r is equal to the inner radius 408 and $l_1$ is equal to the length 416, and L is equal to the length of the gap 400.

At operation 220, the characteristic (e.g., resistivity $\rho$) of the process fluid 101 is compared to a threshold value of the characteristic (e.g., $\rho_{th}$). The threshold value $\rho_{th}$ can be a specific value or a range of values determined based on normal operation data of process fluids. Normal operation data can be reference data collected for normal (or proper) substrate processing. The threshold value $\rho_{th}$ can be a data set stored on a memory device, such as the memory 352.

The threshold value $\rho_{th}$ is stored on a memory device, such as the memory 352. The threshold value corresponds to a level of particle contamination in the process fluid 101. If the measured resistivity ($\rho_m$) of the process fluid 101 is determined to be less than the threshold value $\rho_{th}$ (indicating that the process fluid is suitable for substrate processing), the process fluid 101 can be flowed to the reservoir 113. Here, the controller 344 can send a signal to an input/output device, such as a display unit or an audio device (not shown) indicating that the process fluid can be flowed to the reservoir 113. If the measured resistivity ($\rho_m$) of the process fluid 101 is determined to be greater than or equal to the threshold value ($\rho_m \geq \rho_{th}$), the controller 344 sends a warning to an input/output device, such as a display unit or an audio device (not shown). The warning indicates that an action is to be performed on the process fluid 101.

An example of the action performed of operation 230 can include purifying the process fluid 101. Here, this action can further include feeding the process fluid 101 from the collection unit 103 to the purification unit 111 by opening valve 122, allowing the process fluid 101 to flow from the line 104a to the line 104b. Apparatus in the purification unit 111 reduce a concentration of contaminants in the process fluid 101 such that the measured resistivity $\rho_m$ of the process fluid 101 becomes less than the threshold value $\rho_{th}$. The resistivity of the process fluid 101 can be determined at a new time iteration. The method 200 can repeat for a predetermined time period or for a predetermined number of determination cycles. In addition, and in some embodiments, at least a portion of the process fluid 101 that is measured for the second, third, or nth iteration can include new volumes of process fluid from the collection unit 103.

FIG. 3 is a schematic, cross-sectional view of a probe 300 for measuring one or more characteristics of a process fluid according to at least one embodiment. As a non-limiting example, the probe 300 can be utilized to measure fluid resistivity of the process fluid 101. The probe 300 (e.g., probe 109) includes a measurement section 328 disposed between an upstream coupling 304 coupled to an inlet 301, and a downstream coupling 316 coupled to an outlet 302. In relation to FIG. 1, the inlet 301 can be the line 106b for feeding process fluid to the probe 109, and outlet 302 can be the line 108 for process fluid to exit the probe 109. In one example, the inlet 301 and the outlet 302 are each in-line with and disposed along the fluid inlet 334a and fluid outlet 334b. Each of the upstream coupling 304 and the downstream coupling 316 are fluidically coupled to the inlet 301 and to the outlet 302.

The upstream coupling 304 includes an upstream vertical coupling 308 and an upstream horizontal coupling 312. The upstream vertical coupling 308 is directly coupled to the inlet 301. The upstream horizontal coupling 312 is physically connected to the upstream vertical coupling 308, and the horizontal coupling 312 disposed substantially orthogonal to the upstream vertical coupling 308. The upstream horizontal coupling 312 is fluidically coupled to the inlet 301 and to the outlet 302. The upstream vertical coupling 308 is press-fit to the inlet 301, in one example. In another example, the upstream vertical coupling 308 is heat welded to the inlet 301.

The upstream vertical coupling 308 may include a threaded surface and a threaded nut, whereby the inlet 301 is compressively fit within the upstream vertical coupling 308 by inserting and turning the threaded nut relative to the threaded surface. In yet another example, the upstream vertical coupling 308 has a quick connect or push fitting, which includes a collet, an O-ring surrounding the collet, and a body disposed within the upstream vertical coupling 308. The inlet 301 can be coupled to the upstream vertical coupling 308 by passing the inlet 301 through the collet into body of the upstream vertical coupling 308, creating a seal. The inlet 301 is released from the upstream vertical coupling 308 by relative movement between the collet, body, and inlet 301.

The downstream coupling 316 has a downstream vertical coupling 320 and a downstream horizontal coupling 324. The downstream vertical coupling 320 is directly coupled to the outlet 302. The downstream horizontal coupling 324 is disposed substantially orthogonal to the downstream vertical coupling 320. The downstream vertical coupling 320 is physically connected to the downstream horizontal coupling 324, and the downstream horizontal coupling 324 is fluidically coupled to the inlet 301 and to the outlet 302. Suitable materials for the upstream coupling 304 and the downstream coupling 316 include polymers, plastics, and other non-conductive or non-metallic materials.

Similar to the examples above regarding the upstream vertical coupling 308, each of the upstream horizontal coupling 312, downstream vertical coupling 320, and downstream horizontal coupling 324 can be a configured as a threaded surface and a threaded nut. In another example, the upstream horizontal coupling 312, downstream vertical coupling 320, and downstream horizontal coupling 324 can be a configured as a quick connect or push fitting. In yet another example, each of the upstream horizontal coupling 312, downstream vertical coupling 320, and downstream horizontal coupling 324 may be heat welded.

The measuring system 300 has a measurement section 328 fluidically coupled between the upstream coupling 304 and the downstream coupling 316. The measurement section 328 is physically coupled to the upstream horizontal coupling 312 and the downstream horizontal coupling 324. Process fluid is configured to flow through the inlet 301 and pass through the upstream coupling 304, and then proceed through the measurement section 328, the downstream coupling 316, and exits through the outlet 302.

The measurement section 328 includes a metal rod 332 and a ground electrode 336. The metal rod 332 is connected to a voltage source (not shown). The ground electrode 336 circumscribes the metal rod 332. Accordingly, the metal rod 332 and ground electrode 336 are substantially coaxial. A surface area of the measurement section 328 is defined by an overlap of a surface area of the metal rod 332 and a surface area of the ground electrode 336. As such, a length of the measurement section 328 is less than or equal to a length of the ground electrode 336. Although the measurement section 328 is shown as a substantially linear, the measurement section 328 is not limited to this shape. Suitable configurations of the measurement section 328 may include a bend or a u-shape, so long as a distance between the metal rod 332 and the ground electrode 336 is substantially equal throughout the length of the measurement section 328.

The metal rod 332, in one example, extends horizontally through the upstream horizontal coupling 312 and through each end of the downstream horizontal coupling 324. In one example, the metal rod 332 is a solid cylindrical structure. Exemplary materials include conductive metals such as aluminum, copper, and iron-containing metals. However, the metal rod 332 is not limited to these materials, and can be any conductive metal.

The ground electrode 336 is a conductive metal. The ground electrode 336 is coupled to a ground (not shown), and has a contact 340 on the surface of the ground electrode 336 that is coupled to a controller 344. The ground electrode 336 extends horizontally through at least a portion of the upstream horizontal coupling 312 and through at least a portion of the downstream horizontal coupling 324. The ground electrode 336 is a hollow tube circumscribing the metal rod 332. The ground electrode 336 is a conductive metal, such as aluminum, copper, and iron-containing metals.

A spacer 360 having an outer radius that is substantially equal to an outer radius of the ground electrode 336 is shown. An inner diameter of the spacer 360 has an inner radius that is substantially equal to the outer radius of the metal rod 332. The spacer 360, a substantially hollow rod, is used to compress the metal rod 332 within the upstream horizontal coupling 312 and/or the downstream horizontal coupling 324, as shown. The spacer 360 is made of a non-conductive material, such as a plastic or a polymer. As such, the ground electrode 336 and the metal rod 332 are compressively fit into the upstream horizontal coupling 312 and the downstream horizontal coupling 324.

The controller 344 is electrically coupled to the contact 340 on a surface of the ground electrode 336 of the measurement section 328. A wire 364 electrically connects the controller to the ground electrode 336, via the contact 340. The controller 344 includes a processor 348, memory 352, and support circuits 356. The processor 348 may be one of any form of general purpose microprocessor, or a general purpose central processing unit (CPU), each of which can be used in an industrial setting, such as a programmable logic controller (PLC), supervisory control and data acquisition (SCADA) systems, or other suitable industrial controller.

The memory 352 is non-transitory and may be one or more of readily available memory such as random access memory (RAM), read only memory (ROM), or any other form of digital storage, local or remote. The memory 352 contains instructions, that when executed by the processor 348, facilitates the operation of the measurement section 328. The instructions in the memory 352 are in the form of a program product such as a program that implements the method of the present disclosure. The program code of the program product may conform to any one of a number of different programming languages. Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are examples of the present disclosure. In one example, the disclosure may be implemented as the program product stored on a computer-readable storage media (e.g., memory 352) for use with a computer system (not shown). The program(s) of the program product define functions of the disclosure, described herein.

Figure 4:
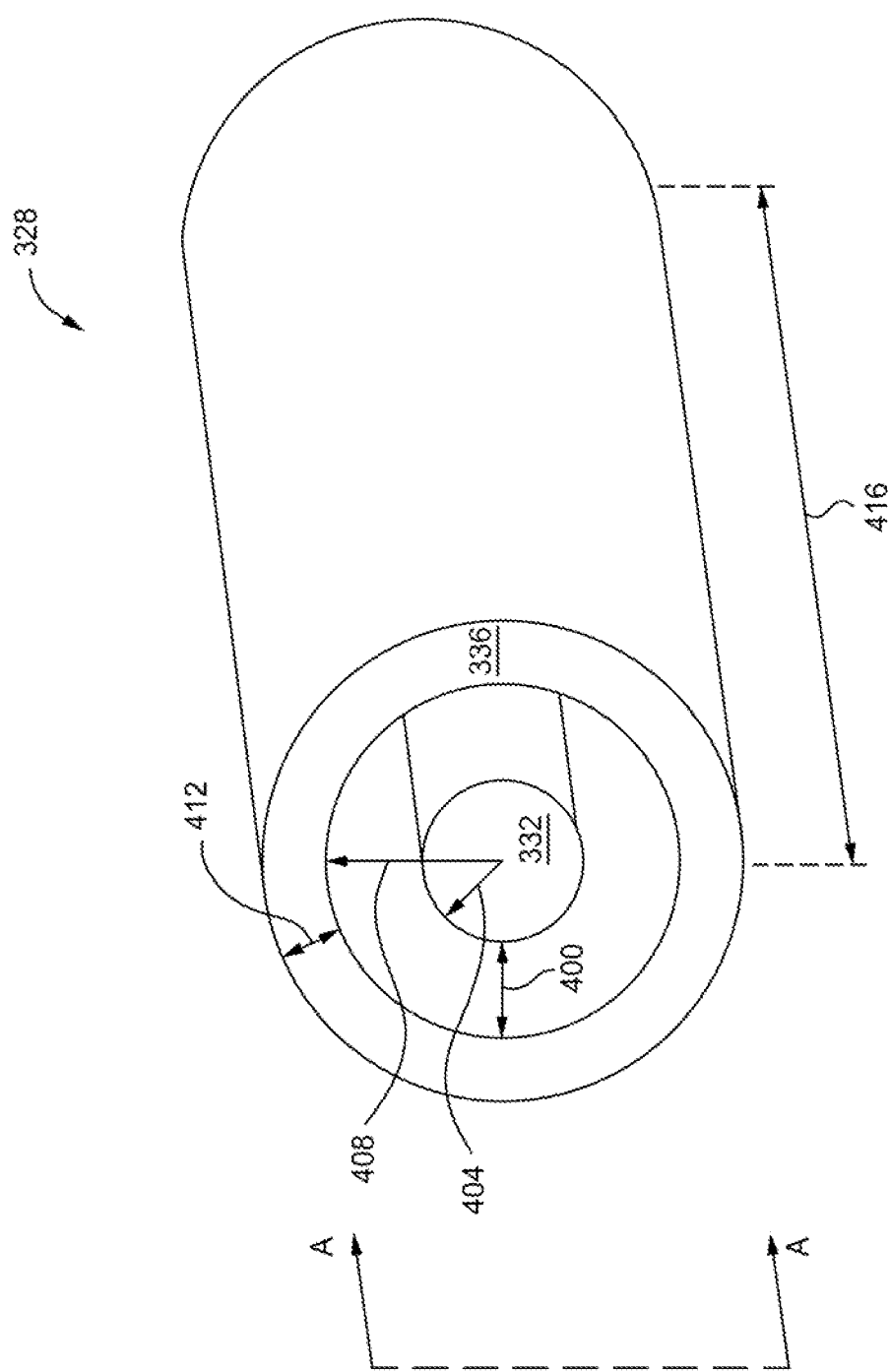
FIG. 4 is an isometric cross-sectional view of the measuring section of the fluid probe, taken along section line A-A in FIG. 3 according to at least one embodiment.

FIG. 4 is an isometric cross-sectional view of the measurement section 328 of the probe 300, taken along A-A in FIG. 3. A gap 400 is defined by the space between the metal rod 332 and the ground electrode 336. A cross-sectional area of the gap 400 is substantially a toroid shape. The metal rod 332 has an outer radius 404, and the metal rod 332 is at least as long as a length 416. As noted above, a total length of the metal rod 332 may be greater than the length 416. The ground electrode 336 has an inner radius 408 and a thickness 412. The gap 400 is the space between the outer radius 404 of the metal rod 332 (i.e., outer surface of the metal rod 332) and the inner radius 408 of the ground electrode 336 (i.e., inner surface of the ground electrode 336). The ground electrode 336 is as long as the length 416. The process fluid flows through the gap 400 while the resistivity of the fluid is measured by the measurement section 328. The inner surface of the ground electrode 336 and the outer surface of the metal rod 332 are each in fluidic contact with the process fluid 101 while the resistivity is determined.

In some embodiments, one or more operations of the apparatus 100 and/or one or more operations of method 200 described herein can be implemented using a programmable logic controller (PLC) and/or can be included as instructions in a computer-readable medium for execution by a control unit (e.g., one or more processors) or any other processing system. The computer-readable medium can include any suitable memory for storing instructions, such as read-only memory (ROM), random access memory (RAM), flash memory, an electrically erasable programmable ROM (EE-PROM), a compact disc ROM (CD-ROM), a floppy disk, punched cards, magnetic tape, and the like.

Embodiments described herein generally relate to apparatus and methods for verification of process fluids. Embodiments described herein enable, e.g., the re-use of process fluids and the determination of whether an unused process fluid is suitable for substrate processing. Lower production costs and higher consistency between substrates can be achieved by embodiments described herein relative to conventional apparatus and methods.

In the foregoing, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the foregoing aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s). As used herein, the indefinite article "a" or "an" shall mean "at least one" unless specified to the contrary or the context clearly indicates otherwise.

While the foregoing is directed to embodiments of the present disclosure, other and further embodiments of the disclosure may be devised without departing from the basic scope thereof, and the scope thereof is determined by the claims that follow.

What is claimed is:

1. An apparatus, comprising:
a tool for performing lithography; and
a recirculation path coupled to the tool, the recirculation path comprising:
a collection unit coupled at first end to a first end of the tool;
a probe coupled at a first end to a second end of the collection unit, the probe for determining one or more characteristics of a fluid flowing from the tool;
a purification unit coupled at a first end to a third end of the collection unit, the purification unit further coupled at a second end to a second end of the probe, the purification unit for changing a characteristic of the fluid; and
a processor, the processor configured to:
control a flow of the fluid from the collection unit to the probe;
determine a first resistivity of the fluid; and
compare the first resistivity of the fluid to a threshold value or range wherein, when the first resistivity is equal to or above the threshold value or range, the processor is further configured to:
determine a second resistivity of the fluid;
compare the second resistivity of the fluid to the threshold value or range;
cause the fluid to flow from the collection unit to the purification unit when the second resistivity is equal to or above the threshold value or range; and
cause the fluid to flow from the collection unit to a reservoir coupled to the recirculation path when the second resistivity is less than the threshold value or range.

2. The apparatus of claim 1, wherein the one or more characteristics comprises a resistivity.

3. The apparatus of claim 1, wherein, when the first resistivity of the fluid is below the threshold value or range, the processor is further configured to cause the fluid to flow from the collection unit to a reservoir, the reservoir coupled to a second end of the tool.

4. The apparatus of claim 1, wherein the processor is further configured to cause the fluid to flow from the collection unit to the purification unit when the first resistivity is equal to or above the threshold value or range.

5. The apparatus of claim 1, wherein the purification unit comprises a polishing filter coupled to a filter comprising activated carbon, ion-exchange resin, molecular sieves, or a membrane.

6. The apparatus of claim 5, wherein the purification unit further comprises a vacuum distillation column coupled to the filter.

7. A method, comprising:
flowing a fluid from a tool to a collection unit, the collection unit disposed along a recirculation path, the recirculation path further comprising a purification unit fluidically coupled to the collection unit;

flowing the fluid from the collection unit to a probe disposed along the recirculation path;
determining a first value of a resistivity of the fluid;
comparing the first value of the resistivity to a threshold value or range;
changing a flow path of the fluid based on the first value;
flowing the fluid to the purification unit when the first value of resistivity is equal to or greater than the threshold value or range;
determining a second value of resistivity of the fluid;
comparing the second value of the resistivity of the fluid to the threshold value or range;
flowing the fluid to the purification unit when the second value of resistivity is equal to or greater than the threshold value or range; and
flowing the fluid to a reservoir coupled to the recirculation path when the second value of resistivity is less than the threshold value or range.

8. The method of claim 7, further comprising flowing the fluid to a reservoir coupled to the recirculation path when the first value of resistivity is below the threshold value or range.

9. The method of claim 8, wherein the reservoir is further coupled to the tool.

10. The method of claim 7, wherein the tool is configured to perform lithography.

11. A method, comprising:
flowing a fluid from a tool to a collection unit, the collection unit disposed along a recirculation path, the recirculation path further comprising a purification unit fluidically coupled to the collection unit;
flowing the fluid from the collection unit to a probe disposed along the recirculation path;
determining a first value of a resistivity of the fluid, wherein determining a first value of the resistivity comprises:
applying a voltage to the probe, the probe having a space through which the fluid flows;
measuring a current flowing through the fluid; and
calculating the first value of resistivity of the fluid based on the voltage and the current;
comparing the first value of resistivity to a threshold value or range; and
changing a flow path of the fluid based on the first value.

12. A non-transitory computer-readable medium storing instructions that, when executed on a processor, perform operations for fluid verification or fluid reclamation, the operations comprising:
flowing a fluid from a tool to a collection unit, the collection unit disposed along a recirculation path, the recirculation path further comprising a probe fluidically coupled to the collection unit, and a purification unit fluidically coupled to the collection unit;
flowing the fluid from the collection unit to the probe;
determining a first resistivity of the fluid;
comparing the first resistivity to a threshold value or range;
changing a flow path of the fluid based on the first resistivity;
flowing the fluid to the probe;
determining a second resistivity of the fluid;
comparing the second resistivity of the fluid to the threshold value or range;
flowing the fluid to the purification unit when the second resistivity is equal to or greater than the threshold value or range; and
flowing the fluid to a reservoir coupled to the tool when the second resistivity is less than the threshold value or range.

13. The non-transitory computer-readable medium of claim 12, wherein the operations further comprise:
flowing the fluid to the purification unit when the first resistivity is equal to or greater than the threshold value or range;
flowing the fluid to a reservoir coupled to the recirculation path when the first resistivity is below the threshold value or range; or
a combination thereof.

14. The non-transitory computer-readable medium of claim 13, wherein the reservoir is further coupled to the tool.

15. The method of claim 11, wherein the tool is configured to perform lithography.

16. The method of claim 11, further comprising:
flowing the fluid to a reservoir coupled to the recirculation path when the first value of resistivity is below the threshold value or range.

17. The method of claim 11, wherein the purification unit comprises a polishing filter coupled to a filter comprising activated carbon, ion-exchange resin, molecular sieves, or a membrane.

18. The method of claim 17, wherein the purification unit further comprises a vacuum distillation column coupled to the filter.

19. The method of claim 7, wherein the purification unit comprises a polishing filter coupled to a filter comprising activated carbon, ion-exchange resin, molecular sieves, or a membrane.

20. The method of claim 19, wherein the purification unit further comprises a vacuum distillation column coupled to the filter.

21. The non-transitory computer-readable medium of claim 12, wherein the tool is configured to perform lithography.

* * * * *